United States Patent [19]

Matthews et al.

[11] Patent Number: 5,001,037
[45] Date of Patent: Mar. 19, 1991

[54] METHOD OF MAKING OVERLAY PROOFS COMPRISING PRECOLORED AND TONED IMAGES

[75] Inventors: Jon W. Matthews, Newark, Del.; Jeffrey W. Milner, Rome; Harvey W. Taylor, Jr., Sayre, both of Pa.

[73] Assignee: E. I. Du Pont de Nemours and Company, Wilmington, Del.

[21] Appl. No.: 475,056

[22] Filed: Feb. 5, 1990

[51] Int. Cl.$^5$ ............................................... G03C 5/00
[52] U.S. Cl. .................................... 430/291; 430/271; 430/273; 430/293; 430/352; 430/326
[58] Field of Search ............... 430/291, 292, 293, 325, 430/326, 271, 273

[56] References Cited

U.S. PATENT DOCUMENTS

| | | | |
|---|---|---|---|
| 3,723,123 | 3/1973 | Jones et al. | 430/291 |
| 4,286,046 | 8/1981 | Chen et al. | 430/291 |
| 4,321,320 | 3/1981 | Romano | 430/291 |
| 4,356,253 | 10/1982 | Buzzell | 430/291 |
| 4,376,158 | 3/1983 | Spechler | 430/291 |
| 4,869,996 | 9/1989 | McCarty et al. | 430/293 |

Primary Examiner—Jack P. Brammer

[57] ABSTRACT

Provided is a multilayer, multicolor overlay proof comprising at least one precolored overlay image and at least one toned overlay image, as well as a process for preparing such an overlay proof.

24 Claims, No Drawings

METHOD OF MAKING OVERLAY PROOFS COMPRISING PRECOLORED AND TONED IMAGES

FIELD OF THE INVENTION

This invention relates to processes for image reproduction. More particularly, it relates to processes in which overlay images are prepared using clear, tonable photosensitive elements and, further, to processes in which these toned overlay images are combined with overlay images prepared from precolored elements.

BACKGROUND OF THE INVENTION

Photosensitive elements which can be used in image-reproduction processes are well-known in the graphics arts industry. Such elements are usually exposed to actinic radiation through an image-bearing transparency, such as a color separation transparency, to produce an image which is either a positive or a negative with respect to the transparency used. Positive-working elements produce an image which is a duplicate of the transparency through which they are exposed. That is, the colored regions of the transparency are also colored in the imaged element and the uncolored regions in the transparency are uncolored in the imaged element. Negative-working elements produce an image that is the reverse of the transparency through which they are exposed. That is, the colored regions of the transparency are uncolored in the imaged element and the uncolored regions in the transparency are colored in the imaged element. Ordinarily, a positive-working element is exposed through a positive transparency to produce a positive image, and a negative-working element is exposed using a negative transparency to produce a positive image. After imagewise exposure, the photosensitive elements may be developed by washout of soluble image areas, by peeling apart, by toning with a colorant, or combinations of these techniques.

Such photosensitive elements are widely used in pre-press or off-press color proofing systems to simulate the images reproduced by printing. Pre-press color proofs include overlay systems and surprint, or single sheet, systems. In an overlay proof, each color is on a separate transparent sheet. The individual films are assembled in register and viewed as a composite against an appropriate background, e.g., an opaque reflective white sheet. In an overlay system the individual colored elements remain separable and can be combined or viewed separately.

Conventional overlay proofing films are precolored by their manufacturers. Thus, in the preparation of overlay images, the operator is limited to those colors provided by the manufacturer. Because of the cost of manufacture, inventory, and distribution, necessarily only a limited range of colors will be available. A number of commercial overlay proofing systems are described in detail in *Principles of Color Proofing*, by Michael H. Bruno, GAMA Communications, Salem, NH, 1986, Chapter V, "Off-Press Color Proofing System—Overlay", pp 133–146, the teachings of which are incorporated by reference.

The process of the invention permits preparation of overlay images with specialty, i.e., non-standard, colors from a non-colored, tonable element. The operator can use precolored overlay films to prepare images requiring standard colors and use the non-colored, tonable element to prepare oned images requiring specialty colors. These precolored and toned images can then be combined to form a multilayer, multicolor overlay proof consisting of toned and precolored images. Because the operator can mix the toners supplied by the manufacturer as desired, toned images with an almost unlimited variety of colors can be prepared. Instead of providing many specialty films, the manufacturer only has to supply precolored films in a limited number of standard colors in addition to a single non-colored, tonable element.

There is a need for such a process by which both precolored and toned overlay images can be prepared from a single set of separation transparencies and combined to form a single, multilayer, multicolor overlay proof.

For such a process to be practical, both the precolored films and the non-colored, tonable element must work in the same sense, i.e., both must be positive or negative working. For example, if the precolored film were negative working and the non-colored, tonable element were positive working, it would be necessary to provide negative separation transparencies to prepare the precolored overlay images and positive separation transparencies to prepare the toned overlay images.

It is also essential that the toned image have the correct left to right orientation when viewed with the toned image down, i.e., away from the observer, and the support up, i.e., facing the observer. This orientation is required to protect the image during normal storage, handling, and use. Therefore, the process must produce a toned image which has the correct left to right orientation when viewed with the toned image down.

Further, such a process must produce both precolored and toned images which have the same right to left orientation as the image being reproduced. None of the images can be a mirror image of the original image.

SUMMARY OF THE INVENTION

The invention provides a process for preparing a multilayer, multicolor overlay proof comprising at least one precolored overlay image and at least one toned overlay image, comprising the steps of:

(A) providing at least two different conventional color separation transparencies of the image to be reproduced, all of which are either positive or negative, and each comprising an emulsion image on a base;

(B) providing at least one precolored photosensitive overlay element and at least one non-colored, tonable photosensitive overlay element, all of which are either positive or negative working as required by said separation transparencies;

(C) exposing a precolored photosensitive overlay element to actinic radiation through its corresponding color separation transparency with the emulsion side of the transparency down, and developing to provide a precolored overlay image;

(D) exposing a non-colored, tonable photosensitive overlay element through a different color separation transparency with the emulsion side of the transparency up, developing and toning with a correspondingly colored toner to provide a toned overlay image, and inverting said toned overlay image to obtain the correct left to right orientation; and (E) assembling in register, said developed precolored overlay image in exposure position and said developed toned overlay image in inverted position to form a multicolored, multilayer overlay proof with correct left to right orientation; wherein steps (C) and (D) may be carried out in either order.

Optionally, steps (C) and/or (D) may be repeated as many times as desired with different color separation transparencies of the image to be reproduced to produce a plurality of different color overlay images which are stacked in register to produce a multilayer, multicolor overlay proof.

In a preferred embodiment of this invention, the non-colored, tonable photosensitive element comprises a photosensitive layer, an elastomeric layer, and a transparent support. In a more preferred embodiment of this invention the non-colored, tonable photosensitive element(s) is a peel-apart photosensitive element comprising a coversheet, a photohardenable layer, an elastomeric layer, and a support. In another more preferred embodiment of this invention the non-colored, tonable photosensitive element(s) is a solvent-processible element comprising a solvent-processible photosensitive layer, an elastomeric layer, and a support. In an even more preferred embodiment of this invention, the non-colored, tonable photosensitive element(s) is a negative-working, peel-apart photosensitive element comprising a coversheet; a photohardenable layer consisting essentially of a monomer, a binder, and a photoinitiator system; an elastomeric layer; and a support.

DETAILED DESCRIPTION OF THE INVENTION

Exposure/Image Formation

In using non-colored, tonable photosensitive elements to prepare single color, toned overlay images from conventional color separation transparencies, each element is exposed to actinic radiation through a transparency. If the transparency is a negative, a negative working element must be used. If the transparency is a positive, a positive working element must be used.

The transparency comprises an imaged emulsion layer on a base. In a conventional exposure, using a conventional pre-colored, overlay proofing element, the transparency is orientated so that the emulsion side of the transparency is in contact with the photosensitive element and the base faces the source of actinic radiation, i.e., the emulsion side is "down." This is the standard exposure procedure, especially with respect to halftone reproduction processes, because mounting the transparency with the emulsion surface not in contact with the photosensitive element is known to alter the image by either dot sharpening and/or dot gain. See, Bruno, *Principles of Color Proofing*, p. 63. Conventional transparencies have the correct left to right orientation with respect to the original when viewed with the emulsion side facing away from the viewer. When a photosensitive element is exposed through such a transparency with the emulsion side of the transparency "down", the photosensitive element will also have the correct left to right orientation when viewed as it was mounted during exposure, i.e., "exposure position".

However, in the process of this invention, the toned overlay image(s) is exposed with the transparency in the inverted position. The transparency is turned over, or inverted, i.e., the emulsion side is "up", so that the emulsion side of the separation transparency faces the source of actinic radiation and the base is in contact with the non-colored, tonable element. The exposed element is then processed and toned, using a toner which corresponds to the color separation transparency used, to produce a toned overlay image. The toned image element is then inverted, i.e., turned over, so that it has the correct left to right orientation. The inversion step also orients the overlay image so that the support is up, i.e., facing the observer, and the toned image down, away from the observer. The overlay image should have the toned image down to protect it during storage, handling, and use.

To form additional toned, single-color overlay images, this sequence of steps may be repeated using additional non-colored, tonable elements combined with different separation transparencies and their corresponding toners.

The precolored photosensitive element, that is, the conventional precolored overlay proofing film, is exposed and processed in the conventional fashion. Actual processing steps will differ depending, e.g., on the structure and chemistry of the element. During exposure the emulsion side of the separation transparency is in contact with the element and the side which does not bear the emulsion faces the source of actinic radiation. This produces a conventional single-color, precolored, overlay image. To form additional precolored single-color overlay images, this sequence of steps may be repeated with different separation transparencies and their corresponding precolored photosensitive elements.

To prepare a multilayer, multicolor overlay proof, the various precolored overlay images and inverted toned overlay images are stacked in register on top of an appropriate receptor. The conventional precolored overlay images are arestacked in "exposure position" and the toned overlay images are stacked in the inverted position, so that all of the images have the correct left to right orientation.

Non-colored, Tonable Photosensitive Elements

The non-colored, tonable photosensitive element may be any of numerous elements known in the art. One type of element comprises a photosensitive layer and a support. Another type comprises, in order, a photosensitive layer, an elastomeric layer, and a support.

Two-Layer Elements

Elements of this type comprise a photosensitive layer and a support. Exposure to actinic radiation changes the photosensitive layer so that it either accepts toner, in the case of negative-working elements, or does not accept, toner, in the case of positive-working elements.

Conventional positive-working non-colored, tonable photosensitive elements are disclosed in Chu, U.S. Pat. No. 3,649,268. These elements comprise a photohardenable layer and a removable support. Exposure raises the tack temperature of the photohardenable layer so that toner does not adhere to exposed areas. For use in this invention, the support need not be removable. It must, however, be optically transparent since it becomes the image carrier for the overlay image. This is true for the support or image carrier of any overlay element whether precolored or noncolored used in this invention.

Negative-working non-colored, tonable photosensitive elements are disclosed in Abele and Grossa, U.S. Pat. No. 4,243,741. These elements comprise a support bearing a layer of a photosensitive composition comprising a thermoplastic binder, at least one dihydropyridine compound and at least one hexaarylbiimidazole (HABI). Exposure changes the exposed areas so they accept toner.

Multi-Layer Elements

Elements of this type comprise, in order, a photosensitive layer an elastomeric layer, and a support. In this type of element, the physical properties of the photosensitive layer are changed on exposure so that either the exposed or the unexposed areas can be removed during processing, uncovering the tonable elastomeric layer.

If the exposed areas are removed, the element is negative working with respect to the transparency used for exposure. If the unexposed areas are removed, the element is positive working with respect to the transparency used for exposure. The uncovered elastomeric layer accepts toner during the toning step. The excess toner is removed from the element, leaving an image consisting of the imaged and processed photosensitive layer, toned elastomeric layer, and support. Optionally, and depending on the nature of the element, the residual photosensitive layer may be removed from the element by further processing as described in Spechler, U.S. Pat. No. 4,376,158. The support provides dimensional stability to the toned elastomeric layer.

Peel-Apart, Tonable Photosensitive Elements

A peel-apart, tonable photosensitive element useful in the process of the invention comprises a coversheet, a photosensitive layer, an elastomeric layer, and a support. In these elements the photosensitive layer is a photohardenable layer, that is, one which is photopolymerizable, photocrosslinkable, and/or photodimerizable.

Negative Working Peel-Apart Elements

Conventional peel-apart photosensitive elements are negative working, that is, when the coversheet is peeled off, the exposed areas are removed with the coversheet, thereby uncovering the tonable elastomeric layer. Such elements are disclosed in Cohen and Fan, U.S. Pat. Nos. 4,247,619 and 4,282,308.

Photohardenable Layer

The photohardenable layer, which is the sole photosensitive layer of the peel-apart element, is one whose adhesive relationship vis-à-vis the coversheet and the elastomeric layer is altered by exposure to actinic radiation. Before exposure, the photohardenable layer adheres more strongly to the elastomeric layer than to the coversheet. If the unexposed element is peeled apart, the photohardenable layer remains on the elastomeric layer. After imagewise exposure of the element with the coversheet in place, the exposed areas of the photohardenable layer adhere more strongly to the coversheet than to the elastomeric layer and are removed with the coversheet.

Monomers/Binders

The preferred photohardenable compositions are photopolymerizale, and comprise a macromolecular organic polymeric binder, an addition polymerizable ethylenically unsaturated monomer, and an initiator or initiator system. The monomer has at least one and preferably two or more terminal ethylenically unsaturated groups capable of free-radical initiated, chain propagated, addition polymerization, and preferably has some degree of polarity. In addition, the monomer must be compatible with the binder and substantially nondiffusible in the elastomeric layer. Useful monomers include epoxy monomers containing ethylenic unsaturation, such as are disclosed in U.S. Pat. No. 3,661,576. Preferred monomers are the diacrylate and dimethacrylate esters of the epichlorohydrin adduct of bis-phenol A. Suitable binders include polymers of methyl acrylate, methyl methacrylate, and copolymers thereof. A preferred binder is poly(methyl methacrylate).

Initiator Systems

The initiator system comprises one or more compounds which directly furnish free-radicals when activated by actinic radiation. It can also comprise a plurality of compounds, one of which yields the free-radicals after having been caused to do so by another compound, or sensitizer, which has been activated by the radiation.

Numerous conventional initiator systems may be used to initiate photopolymerization provided they (1) are compatible with the other ingredients of the system, (2) do not alter the unique relationship between the coversheet, the elastomeric layer, and the exposed and unexposed photohardenable layer required for the operation of the peel-apart element, and (3) do not impart unwanted color to the final image.

Preferred initiator systems are 2,4,5-triphenylimidazolyl dimers in combination with chain transfer agents, or hydrogen donors, and mixtures thereof. Preferred HABI's (hexaarylbisimidazoles) are 2-o-chlorosubstituted hexaphenylbisimidazoles in which the other positions on the phenyl radicals are unsubstituted or substituted with chloro, methyl or methoxy. The most preferred initiator is o-Cl-HABI, i.e., 1,1'-biimidazole,2,2'-bis(o-chlorophenyl)-4,4,'5,5'-tetraphennyl-. A preferred sensitizer is 7-diethylamino-4-methylcoumarin.

Hydrogen donor compounds useful as chain transfer agents in the photopolymer compositions include: 2-mercaptobenzoxazole, 2-mercaptobenzothiazole, 4-methyl-4H-1,2,4,triazole-3-thiol, and the like. A preferred hydrogen donor is 2-mercaptobenzoxazole.

Other Ingredients

The photohardenable layer may also contain other ingredients which are conventional components used in photohardenable systems subject to the conditions that they (1) must be compatible with the other ingredients present in the photohardenable layer, (2) do not alter the unique relationship between the elastomeric layer, the unexposed and exposed photohardenable layer, and the coversheet required by the peel-apart photosensitive element, and (3) do not impart unwanted color to the final image. Such components may include stabilizers, antihalation agents, optical brightening agents, release agents, surfactants, coating aids, and plasticizers.

Normally a conventional thermal polymerization inhibitor will be present to increase stability in the storage of the photohardenable composition. The dinitroso dimers described in Pazos, U.S. Pat. No. 4,168,982, may also be useful. Since monomers generally contain thermal polymerization inhibitors added by their manufacturers, it is frequently unnecessary to add additional inhibitor.

Nonionic surfactants may be added to the photohardenable layer as coating aids. Preferred coating aids are polyethylene oxide, such as Polyox ® WSRN 3000, and fluorinated nonionic surfactants, such as Fluorad ® FC-430.

By the incorporation of optical brightening agents into the photohardenable layer, the image record is produced free from distortion due to halation effects. Particularly useful optical brighteners are 2-(stibyl-4")-(naphtho-1',2',4,5)-1,2,3-triazol-2"'-sulfonic acid phenyl ester and 7-(4'-chloro-6'-diethylamino-1',3',5'-triazine-4'-yl)amino-3-phenyl coumarin. Useful ultraviolet radiation absorbing materials and brighteners are disclosed in U.S. Pat. No. 3,854,950.

Composition

The binder/monomer ratio may vary widely but in general should be about 3:1 to 1:3. The monomer should be compatible with, and may be a solvent for, and/or have a plasticizing action on the binder. The proportions of monomer and binder are made in accordance with the requirements of selective photoadhesion and hardness. In order to provide a suitable hardness, the monomer concentration is normally kept low so that the photohardenable layer will be sufficiently hard and nontacky. The amounts of ingredients will generally be within the following percentage ranges, based on total weight of the photohardenable layer: monomer, 5–60%, preferably 15–50%; initiator system 0.1% to 10%, preferred 1–5%; binder, 25–75%, preferably 45–65%; other ingredients 0–5%, preferably 0.5–5%.

Elastomeric Layer

The elastomeric layer is a tacky or slightly soft, deformable material. For an element with good aging stability, suitable materials for the elastomeric layer should restrain monomer diffusion from the photohardenable layer into the elastomeric layer. In addition, these materials must be nonmigratory into the photohardenable layer. Preferred materials are elastomeric polymers and mixtures thereof, which are inherently tacky at ambient temperatures. Especially preferred materials for the elastomeric layer are polymers of butadiene or isoprene and random, teleblock and block copolymers of butadiene or isoprene copolymerized with styrene.

Coversheet

The non-colored, tonable peel-apart photosensitive elements have a coversheet which is strippable, i.e., removable by peeling it apart from the rest of the element. The adhesive relationship of the coversheet to the photohardenable layer is such that, after the photohardenable layer has been exposed to actinic radiation, the exposed (i.e., polymerized) areas of the photohardenable layer adhere more strongly to the coversheet than to the elastomeric layer and are removed with the coversheet. The unexposed (i.e., unpolymerized) areas of the photohardenable layer adhere more strongly to the elastomeric layer than to the coversheet and remain on the elastomeric layer.

The coversheet must be transparent to actinic radiation since irradiation is carried out through the coversheet. Preferred materials for the coversheet are polymeric films, particularly polyethylene terephthalate.

In order to make the exposed areas of the photohardenable layer adhere better to the coversheet, the surface of the coversheet may be modified; for example, the topography may be altered and the polarity increased by a surface treatment such as electrostatic discharge or flame treatment. Photosensitive elements comprising electrostatic discharge treated polyethylene terephthalate film are disclosed in Buzzell, U.S. Pat. No. 4,356,253. Flame treatment of the film also will provide good photoadhesion. An air-propane flame may be used.

The coversheet should be thick enough so that electrostatic discharge or flame treatment will not injure it and so that it may be stripped without tearing. While the thickness may be varied over a wide range, films having a thickness of about 0.5–3.0 mil (13–75 micrometer), preferably 0.5–2.0 mil (13–50 micrometer) can be used. Thinner coversheets produce halftone dots of good roundness with sharp edges. In general, a rapid rate of coversheet stripping produces better image quality.

Support

The elastomeric layer is present on a support. In conventional non-colored photosensitive elements the support is releasable so that it may be removed as each successive exposed, processed, and toned element becomes part of a surprint proof. For use in a surprint, the support need not be transparent since it does not become part of the final image.

In contrast, in all of the tonable elements used in the processes of this invention the support becomes the carrier for the final overlay image. Therefore, it need not be releasable from the elastomeric layer. It must, however, be transparent and must of be of sufficient thickness to provide dimensional stability to the toned elastomeric layer during processing, toning, and ordinary use.

The support may be any suitably transparent film which has the necessary stiffness and dimensional stability and which exhibits proper adhesion to the elastomeric layer. Clear polyethylene terephthalate film is preferred. While the thickness may be varied over a wide range, films having a thickness of about 2–3 mil (50–75 micrometer) are preferred.

Manufacture

The photosensitive element may be prepared using conventional coating techniques. The photohardenable layer is coated onto the coversheet. After the solvent has evaporated, a release film, such as polyethylene, may be placed over the coating to protect the photohardenable layer until the rest of the element is formed. The elastomeric layer is coated over the photohardenable layer. If a release film is present on the photohardenable layer, it must be stripped off before the elastomeric layer is coated. After the solvent has evaporated, the support is laminated to the surface of the elastomeric layer. The solvent for the elastomeric layer should not have any solubilizing or deleterious effect on photohardenable layer.

Alternatively, the photohardenable layer may be coated onto the coversheet and the elastomeric layer coated onto the support. The photohardenable layer and the elastomeric layer are laminated together under pressure at room temperature or elevated temperature.

The element may also be prepared using conventional multilayer coating techniques. The photohardenable layer and the elastomeric layer may be coated simultaneously onto the coversheet, and the support laminated to the elastomeric layer.

The photohardenable layer is prepared by mixing the ingredients of the system in a suitable solvent, such as dichloromethane, usually in the weight ratio of about 15:85 to 25:75 (solids to solvent), coating onto the coversheet, and evaporating the solvent. Coating should be uniform. A coating weight of about 35–40 mg/dm$^2$, generally providing a dry thickness of about 3.5 to 4.0 microns, is preferred.

Any suitable solvent may be used to coat the elastomeric layer. When the elastomeric layer and photohardenable layer are coated simultaneously, the solvents should not cause significant migration of the components between the two layers. Coatings should be uniform and typically have a thickness of 3 to 15 microns, preferably 7 to 12 microns, when dry. Dry coating weight will be about 30 to 200 mg/dm$^2$, preferably 70 to 120 mg/dm$^2$.

Positive Working Peel-Apart Elements

Conventional peel-apart, tonable photosensitive elements are negative working. However, they may also be made positive working by appropriate modification in composition and/or process of use.

Positive working, peel-apart photosensitive elements are disclosed in Cohen and Fan, U.S. Pat. No. 4,304,839. The binders used in these elements were: a chlorinated rubber, a chlorinated rubber/poly(methyl methacrylate) mixture, and a 3:41:48:9 acrylonitrile/styrene/butadiene/methyl methacrylate co-polymer.

A positive working, peel-apart photosensitive element is described in co-assigned U.S. Pat. application Ser. No. 07/318,586, filed 3/3/89. This element comprises, in order, a coversheet; a photorelease layer, consisting essentially of a solid, oxyethylene homopolymer of the formula, H(OCH$_2$CH$_2$)$_n$OH, with a molecular weight greater than about 3,000; a photohardenable layer; an elastomeric layer; and a support. The composition of the photohardenable and elastomeric layers is as described above for negative peel-apart elements. The photorelease layer is about 0.05 microns to 0.2 microns thick. The preferred oxyethylene homopolymer is polyethylene oxide of molecular weight 100,000 to 600,000. The preferred coversheet is untreated polyethylene terephthalate film. Addition of the photorelease layer to the element reverses the normal peel-apart behavior. The non-polymerized areas adhere to the coversheet and the polymerized areas adhere to the elastomeric layer.

A process for reversing the normal peel-apart behavior of conventional peel-apart photosensitive elements is disclosed in co-assigned U.S. Pat. application Ser. No. 07/391,785, filed 8/4/89. In this process the coversheet is removed and the element, minus the coversheet, imagewise exposed to actinic radiation in the conventional manner. Then the coversheet is relaminated to the element and the element, with the relaminated coversheet, overall exposed to actinic radiation and peeled-apart in the conventional manner. The areas which were not exposed during imagewise irradiation adhere to the coversheet and are removed, uncovering the elastomeric layer, which may then be toned in an imagewise manner.

Solvent-Processible, Tonable Photosensitive Elements

Solvent-processible, tonable photosensitive elements comprise a photosensitive layer, an elastomeric layer, and a support. In these elements the photosensitive layer is either photosolubilizable, that is, after exposure to actinic radiation it becomes soluble in the processing solvent, or photoinsolubilizable, that is, after exposure to actinic radiation it becomes insoluble in the processing solvent. If the photosensitive layer is photosolubilizable, the element is negative working. If the photosensitive layer is photoinsolubilizable, the element is positive working.

Positive Working Solvent-Processible Tonable Elements

Fan, U.S. Pat. No. 4,053,313, discloses positive working, solvent processible elements. The photosensitive layer is a photohardenable layer similar to that used in conventional negative working peel-apart photosensitive elements. Processing is by washing out the unexposed image areas with an organic solvent. The revealed underlying tonable elastomeric layer may then be toned.

Negative Working Solvent-Processible Tonable Elements

Spechler, U.S. Pat. No. 4,376,158, discloses negative working, solvent processible elements in which the photosolubilizable layer is a napthaquinone diazide sensitized Novalac ® resin. Washout of the exposed image areas is with aqueous sodium hydroxide. This element has the additional advantage that the portion of the photosolubilizable layer remaining following exposure and washout is still photoactive. It can be removed by overall exposure and washout to leave an image consisting of toned elastomeric layer and support.

Fan, U.S. Pat. No. 4,053,313, discloses negative working, solvent processible elements. The photosensitive layer is a photohardenable layer similar to that used in conventional negative working peel-apart photosensitive elements except that a nitroaromatic photoinhibitor is used to reverse the normal behavior of the photohardenable layer. Nitroaromatic photoinhibitors and their process of use are disclosed in Pazos, U.S. Pat. No. 4,269,933 and Dueber and Nebe, U.S. Pat. No. 4,477,556. In this case the photosensitive layer is photoinsolubilizable, but the element is positive working because the nitroaromatic photoinhibitor reverses the normal behavior of the element.

Exposure/Image Formation

Any convenient source providing actinic radiation absorbed by the photoactive agent present in the element may be used to expose any of the elements herein described. The "photoactive agent" is the species, or group of species, which absorb light and initiate the photoimaging reaction. "Actinic radiation" is any radiation which initiates the photosensitive reaction. The radiation can be natural or artificial, monochromatic or polychromatic, incoherent or coherent. For efficient image formation most of the actinic radiation should be absorbed by the photoactive agent. Conventional sources of actinic radiation include fluorescent, mercury vapor, mercury-xenon, metal additive, and arc lamps. Useful sources of coherent radiation are lasers whose emissions fall within or overlap the absorption bands of the photoactive agent.

Exposure is conventionally carried out through an image-bearing transparency, preferably a half-tone or continuous-tone color separation transparency. However, other means, such as a modulated scanning laser beam, CRT (cathode ray tube), and the like, are alternative ways of imagewise exposing the elements and are considered to be equivalent. However, if sources such as these are used, special means of inverting the image (i.e., creating a mirror image exposure) would have to be devised. It would be necessary to invert the image electronically, in the case of, for example, an electronic imaging system, or to expose the non-colored, tonable element in the inverted position as described above. Such processes are considered equivalent to inverting the transparency.

Following exposure and processing, the element is colored by applying a suitable colorant, generally know as a toner. After the excess toner is removed, toner will remain only on the exposed image areas, in the case of negative working elements, or unexposed image areas, in the case of positive working elements. Suitable toners are described in Chu et al., U.S. Pat. No. 3,620,726; Gray, U.S. Pat. No. 3,909,282; Manger et al., U.S. Pat. No. 4,215,193; and Ruskin, U.S. Pat. No. 4,661,439. Toners may be applied by dusting with pads dipped in toners (Burg et al., U.S. Pat. No. 3,060,024); transfer (Burg et al., U.S. Pat. No. 3,060,025); hand-operated machine toning (Sandner, U.S. Pat. No. 4,019,821); and automatic toning (Tobias, U.S. Pat. No. 4,069,791).

Precolored Overlay Proofing Systems

Any conventional precolored overlay proofing film, or combination thereof, may be used in the process of this invention. Overlay systems vary considerably as to their structure and chemical composition, but each provides a colored image on a relatively clear, dimensionally stable transparent film. Commercially available overlay color proofing films include: Cromacheck® (Du Pont, Wilmington, DE), Color Key® (3M, St. Paul, MN), and NAPS and PAPS (Enco Printing Products, Somerville, NJ). These systems are described in detail in *Principles of Color Proofing*, by Michael H. Bruno, GAMA Communications, Salem, NH, 1986, Chapter V, "Off-Press Color Proofing Systems—Overlay", pp 133–146, the teachings of which are incorporated by reference.

Cromacheck® overlay color proofing film is a totally dry, negative-working, precolored overlay color proofing film. Images are produced by exposure and peeling-apart of the exposed film. Each film comprises a photosensitive layer comprising an ultraviolet-sensitive photopolymer composition containing an appropriate process color pigment. This layer is protected on the top and bottom by polymer films. Exposure changes the characteristics of the photopolymer so that the exposed areas adhere to the top film when the films are peeled apart. This top film with its adherent colored image areas becomes the negative overlay image. Cromacheck® overlay color proofing film is similar in structure and composition to the peel-apart photosensitive elements described in Taylor, U.S. Pat. No. 4,489,154, the disclosure of which is incorporated by reference.

Color Key® overlay color proofing film is a solvent-processible, negative-working, precolored proofing film. The film comprises a diazo light sensitive coating covered by a pigmented lacquer. Exposure changes the solubility of the exposed light-sensitive layer so that it and the overlying pigment layer is removed during solvent processing.

NAPS and PAPS are, respectively, negative-working and positive-working precolored overlay proofing films. Dye sensitized coatings are used instead of pigments. Processing is by washout.

INDUSTRIAL APPLICABILITY

The processes of this invention are useful for preparing colored images. These images are particularly useful in the graphic arts field, especially in the area of color proofing, wherein proofs are prepared to duplicate the images produced by printing.

The advantageous properties of this invention can be observed by reference to the following examples which illustrate, but do not limit, the invention.

| | EXAMPLES |
|---|---|
| | GLOSSARY |
| o-Cl-HABI | 1,1'-Biimidazole, 2,2'-bis [o-chloro-phenyl]-4,4',5,5'-tetraphenyl-; CAS 1707-68-2 |
| Elvacite ® 2051 | Poly(methyl methacrylate); MW 350,000; E. I. dePont de Nemours and Company, Wilmington, DE |
| Gentro ® 1506/27 | Styrene-butadiene random copolymeric rubber; Gen Corp., Akron, OH |
| Irganox ® 1010 | Tetra-bis methylene 3-(3,5-di-tert-butyl-4-hydroxyphenyl) propionate methane; Ciba-Geigy, Hawthorne, NY |
| 2-MBO | 2-Mercaptobenzoxazole; 2-Benzoxazolethiol; CAS 2382-96-9 |
| Novacure ® 3704 | Methacrylate ester of the ipichlorohydrin adduct of bis-phenol A; Rad-Cure, Louisville, KY |
| Polyox ® WSRN 3000 | Polyethylene oxide, MW 400,000; Union Carbide, Danbury, CT |
| Taktene ® CB221 | Poly (cis-butadiene); B. F. Goodrich, Cleveland, OH |
| Tinopal ® PCR | 2-(Stibyl-4")-(naphtho-1',2',4,5)-1,2,3-triazol-2"-sulfonic acid phenyl ester; Benzenesulfonic acid, 5-(2H-naphtho<1,2-D>triazole-2-yl)-2-(2-phenylethyl)-, phenyl ester; CAS 6994-51-0; Ciba-Geigy, Hawthorne, NY |
| Tinopal ® SFG | 3-Phenyl-7-[2'-(4'-N,N-diethylamino-6'-chloro-1',3',5'-triazinylamino]-coumarin; Ciba-Geigy, Hawthorne, NY |
| Tinuvin ® 328 | 2-(2'-Hydroxy-3',5'-di-tert-amylphenyl)-benzotriazole; Ciba-Geigy, Hawthorne, NY |

EXAMPLE 1

This example illustrates the preparation of a multicolored overlay proof using overlay images formed from commercial precolored overlay proofing film combined with images formed from non-colored, tonable elements. The assembled overlay proof contains seven images, as represented by a set of seven negative separation transparencies of the original image to be reproduced. The yellow, magenta, cyan, and black separation transparencies are conventional half-tone color separation transparencies. The gold, silver, and bronze transparencies are conventional continuous tone transparencies. The yellow, cyan, and black images were prepared from commercial precolored overlay proofing films. The magenta, silver, gold, and bronze images were prepared by toning non-colored, tonable photohardenable elements.

The precolored films are commericial Cromacheck® overlay color proofing films, similar in composition, structure, and method of manufacture to those disclosed in Example 1 of U.S. Pat. No. 4,489,154.

To prepare the non-colored, tonable photohardenable elements, the photohardenable layer described below was coated on an about 13 micrometer (0.5 mil) thick clear polyethylene terephthalate coversheet which has been surface treated with an electric discharge of about 0.544 coulomb/$m^2$ (22.5% solids from 96:4 dichloromethane/methanol solvent system) at a coating weight of about 40 mg/$dm^2$. The elastomeric layer is 79.5% Taktene®221, 20.0% Gentro®1506, and 0.5% of Irganox®1010, coated on the support (7.7% solids from dichloromethane solvent) at about 125 mg/dm². The support is an about 50 micron (2 mil) thick clear polyethylene terephthalate film. The photohardenable layer and the elastomeric layer were laminated together at room temperature and about 40 pounds per in² pressure to form a non-colored, tonable negative-working, peel-apart overlay element.

TABLE 1

| COMPOSITION OF THE NON-COLORED PHOTOHARDENABLE LAYER[a] | |
|---|---|
| Elvacite ® 2051 | 43.51 |
| Novacure ® 3704 | 49.79 |
| o-Cl HABI | 2.50 |
| 2-MBO | 1.50 |
| Tinopal ® PCR | 0.50 |
| Tinopal ® SFG | 1.50 |
| Tinuvin ® 328 | 0.20 |
| Polyox ® WSRN 3000 | 0.50 |

[a]in precent

Step 1. A sheet of yellow Cromacheck ® overlay color proofing film was placed in a vacuum frame with the coversheet up, i.e. facing the light source. The yellow half-tone negative separation transparency was placed on top of the coversheet with the emulsion side in contact with the coversheet and the base side up. A vacuum was drawn on the element and separation transparency for 90 sec prior to exposure. The element was exposed for about 36 sec with the radiation from an unfiltered 5 kw high pressure mercury vapor lamp (Violux ® 5002S, Exposure Systems Company, Bridgeport, CT, equipped with a photopolymer bulb) about 54 in (137 cm) above the element and separation transparency. The exposed precolored film was removed from the vacuum frame and placed on a vacuum easel. The clear polyethylene terephthalate coversheet was removed by peeling back at 180° ("peel-back mode") in a smooth, continuous motion. A yellow overlay image was produced on the coversheet. Correct left to right orientation vis-à-vis the original is achieved by viewing the image through the transparent coversheet, with the colored image on the side away from the viewer.

Step 2. A non-colored, tonable photosensitive element was placed in a vacuum frame with the coversheet up. The magenta half-tone negative separation transparency was placed on top of the coversheet in the inverted position, i.e., with the emulsion side up and the base side in contact with the coversheet. A vacuum was drawn on the element and separation transparency for 90 sec prior to exposure. The element was exposed through the inverted magenta negative separation transparency as described in Step 1. The exposed non-colored, tonable element was removed from the vacuum frame and placed on a vacuum easel. The clear polyethylene terephthalate coversheet was removed by peeling back at 180° ("peel-back mode") in a smooth, continuous motion. The uncovered areas of the elastomeric layer were toned with Du Pont negative Cromalin ® FP 1 fluorescent pink toner using conventional hand toning techniques. A toned magenta overlay image which is a negative of the separation transparency, was produced on the transparent support. This image was inverted (i.e., turned over so that the support was "up", i.e., facing the observer, and the toned side was "down", i.e., away from the observer) to produce a magenta overlay image with the correct left to right orientation. This image was stacked in register with the precolored overlay image produced in Step 1 to produce a two color overlay proof containing a precolored image and a toned image, both of which have the correct left to right orientation.

Step 3. A sheet of cyan Cromacheck ® overlay color proofing film was placed in a vacuum frame with the coversheet up, i.e. facing the light source. The cyan half-tone negative separation transparency was placed on top of the coversheet with the emulsion side in contact with the coversheet and the base side up. The element was exposed and peeled-apart as described in Step 1 to produce a cyan overlay image on the coversheet. This image was stacked in register with the images produced in the preceding steps to produce a three color overlay proof containing two precolored images and a toned image, all of which have the correct left to right orientation.

Step 4. A non-colored, tonable photosensitive element was placed in a vacuum frame with the coversheet up. A silver continuous tone negative separation transparency was placed on top of the coversheet in the inverted position, i.e., with the emulsion side up and the base side in contact with the coversheet. The element was exposed, peeled-apart, toned with MS1 metallic silver toner, and inverted as described in Step 2 to produce a silver overlay image with the correct left to right orientation. This image was stacked in register with the images produced in the preceding steps to produce a four color overlay proof containing two precolored images and two toned images, all of which have the correct left to right orientation.

Step 5. A non-colored, tonable photosensitive element was placed in a vacuum frame with the coversheet up. The gold continuous tone negative separation transparency was placed on top of the coversheet in the inverted position, i.e., with the emulsion side up and the base side in contact with the coversheet. The element was exposed, peeled-apart, toned with MG3 metallic gold toner, and inverted as described in Step 2 to produce a gold overlay image with the correct left to right orientation. This image was stacked in register with the images produced in the preceding steps to produce a five color overlay proof containing two precolored images and three toned images, all of which have the correct left to right orientation.

Step 6. The non-colored, tonable photosensitive element was placed in a vacuum frame with the coversheet up. The copper continuous tone negative separation transparency was placed on top of the coversheet in the inverted position, i.e., with the emulsion side up and the base side in contact with the coversheet. The element was exposed, peeled-apart, toned with MB1 metallic copper toner, and inverted as described in Step 2 to produce a copper overlay image with the correct left to right orientation. This image was stacked in register with the images produced in the preceding steps to produce a six color overlay proof containing two precolored images and four toned images, all of which have the correct left to right orientation.

Step 7. A sheet of black Cromacheck ® overlay color proofing film was placed in a vacuum frame with the coversheet up, i.e., facing the light source. The black half-tone negative separation transparency was placed on top of the coversheet with the emulsion side in contact with the coversheet and the base side up. The element was exposed and peeled-apart as described in Step 1 to produce a conventional black overlay image. This image was stacked in register with the images produced in the preceding steps to produce a seven color overlay proof containing three precolored overlay images and four toned overlay images, all of which have the correct left to right orientation.

EXAMPLE 2

This example illustrates the preparation of a multicolor overlay proof using images formed from a different commercial precolored overlay proofing film combined with an image formed from a non-colored, tonable element. The overlay proof contains five images. The yellow, magenta, cyan, and black images were prepared from commercial precolored overlay proofing films. The gold image was prepared by toning a non-colored, tonable photohardenable element.

A set of four color overlay images was prepared as directed by the manufacturer from a set of four conventional half-tone negative separation transparencies using NAPS (Enco Printing Products, Somerville, N.J.) negative overlay color proofing films colored yellow, magenta, cyan, and black. Exposure was carried out as prescribed by the manufacturer, i.e., in a vacuum frame with the emulsion side of the negative in contact with the emulsion side of the overlay proofing film and the base of the transparency facing the source of actinic radiation. The overlay films are each viewed as exposed with the emulsion side up, facing the viewer, to achieve the correct left to right orientation.

A gold, toned overlay image was formed following the procedure of Example 1, Step 2. The non-colored, tonable photosensitive element described in Example 1 was placed in a vacuum frame with the coversheet up. A gold continuous tone negative separation transparency was placed on top of the coversheet in the inverted position, i.e., with the emulsion side facing the source of actinic radiation and the base side in contact with the coversheet. A vacuum was drawn on the element and separation transparency. The element was exposed, peeled-apart, and toned with a conventional Du Pont Cromalin ® metallic gold toner. The toned gold overlay image was then inverted, as described in Example 1, Step 2, and assembled in register with the four precolored overlay images, to produce a five-color, five-layer overlay proof.

EXAMPLE 3

This example illustrates the preparation of a multicolor overlay proof using images formed from yet a different commercial precolored overlay proofing film combined with an image formed from a non-colored, tonable element. The overlay proof contains five color separation images. The yellow, magenta, cyan, and black images were prepared from commercial precolored overlay proofing films. The silver image was prepared by toning a non-colored, tonable photohardenable element.

A set of four color overlay images was prepared as directed by the manufacturer from a set of conventional half-tone negative separation transparencies using Color Key ® (3M, St. Paul, Minn.) negative overlay color proofing films colored yellow, magenta, cyan and black. Exposure was carried out as prescribed by the manufacturer, i.e., in a vacuum frame with the emulsion side of the negative in contact with the overlay proofing film and the base facing the source of actinic radiation. The Color Key film is placed in the vacuum with the pigmented photosensitive coating facing away from the light source. The processed overlay images are also assembled and viewed with the image side down, facing away from the viewer.

A silver, toned overlay image was formed following the procedure of Example 1, Step 2. A non-colored, tonable photosensitive element as described in Example 1 was placed in a vacuum frame with the coversheet up. A silver continuous tone negative separation transparency was placed on top of the coversheet in the inverted position, i.e., with the emulsion side facing the source of actinic radiation and the base side in contact with the coversheet. A vacuum was drawn on the element and separation transparency. The element was exposed, peeled-apart, and toned with a Du Pont Cromalin ® metallic silver toner.

The silver, toned overlay image was inverted as described in Example 1, Step 2, to produce a silver overlay image with the proper left to right orientation. The five overlay images were stacked in register on a receptor of heavy white paper to produce a five color overlay image consisting of, in order from bottom to top: receptor, yellow precolored overlay image, magenta precolored overlay image, cyan precolored overlay image, black precolored overlay image, and silver toned overlay image.

Although the foregoing disclosure is believed sufficient to permit those skilled in the art to fully understand and practice the invention, a number of patents and other references cited in the specification are considered valuable sources of additional information. These cited materials are hereby incorporated by reference.

Having described the invention, we now claim the following and their equivalents.

What is claimed is:

1. A process for preparing a multilayer, multicolor overlay proof comprising at least one precolored overlay image and at least one toned overlay image, comprising the steps of:
   (A) providing at least two different conventional color separation transparencies of the image to be reproduced, all of which are either positive or negative, and each comprising an emulsion image on a base;
   (B) providing at least one precolored photosensitive overlay element and at least one non-colored, tonable photosensitive overlay element, all of which are either positive or negative working as required by said separation transparencies;
   (C) exposing a precolored photosensitive overlay element to actinic radiation through its corresponding color separation transparency with the emulsion side of the transparency down, and developing to provide a precolored overlay image;
   (D) exposing a non-colored, tonable photosensitive element through a different color separation transparency with the emulsion side of the transparency up, developing and toning with a correspondingly colored toner to provide a toned overlay image, and inverting said toned overlay image to obtain the correct left to right orientation; and
   (E) assembling in register, said developed precolored overlay image in exposure position and said developed toned overlay image in inverted position to form a multilayer, multicolor overlay proof with correct left to right orientation;
wherein steps (C) and (D) may be carried out in either order.

2. A process of claim 1 wherein steps (C) and/or (D) are repeated one or more times, each time using a different color separation transparency and either a correspondingly precolored photosensitive overlay element or a non-colored, tonable photosensitive overlay element and a correspondingly colored toner, to produce a multilayer, multicolor overlay proof.

3. A process of claim 1 which utilizes a precolored photosensitive overlay element colored yellow, magenta, cyan, or black.

4. A process of claim 2 which utilizes precolored photosensitive overlay elements colored yellow, magenta, cyan, and black.

5. A process of claim 1 wherein said color separation transparencies are negatives and said photosensitive overlay elements are negative working.

6. A process of claim 1 wherein said color separation transparencies are positives and said photosensitive overlay elements are positive working.

7. A process of claim 1 wherein said non-colored, tonable photosensitive overlay element comprises, in order, a photosensitive layer, an elastomeric layer, and a transparent support.

8. A process of claim 7 wherein said non-colored, tonable photosensitive overlay element is a peel-apart element comprising, in order, a coversheet, a photohardenable photosensitive layer, an elastomeric layer, and a transparent support.

9. A process of claim 8 wherein said peel-apart element is negative working.

10. A process of claim 8 wherein steps (C) and/or (D) are repeated one or more times, each time using a different color separation transparency and either a correspondingly precolored photosensitive overlay element or a non-colored, tonable photosensitive overlay element and a correspondingly colored toner, to produce a multilayer, multicolor overlay proof.

11. A process of claim 9 which utilizes a precolored photosensitive overlay element colored yellow, magenta, cyan, or black.

12. A process of claim 10 which utilizes precolored photosensitive overlay elements colored yellow, magenta, cyan, and black.

13. A process of claim 8 wherein said peel-apart element is positive working.

14. A process of claim 13 wherein said peel-apart element additionally comprises a photorelease layer between said coversheet and said photohardenable photosensitive layer.

15. A process of claim 7 wherein said non-colored, tonable photosensitive element is a solvent-processible element comprising, in order, a solvent-processible photosensitive layer, an elastomeric layer, and a transparent support.

16. A process of claim 15 wherein said solvent-processible element is negative working.

17. A process of claim 15 additionally comprising the steps of exposing said toned overlay image to actinic radiation overall and solvent-processing to remove the residual photosensitive layer following step (D) and preceding step (E).

18. A process of claim 15 wherein said solvent-processible element is positive working.

19. A process of claim 18 wherein said positive working solvent-processible element comprises a photohardenable photosensitive layer.

20. A process of claim 1 wherein said non-colored, tonable photosensitive overlay element comprises a photosensitive layer on a transparent support.

21. A process of claim 20 wherein said non-colored, tonable photosensitive overlay element is positive working.

22. A process of claim 21 wherein said non-colored, tonable photosensitive overlay element comprises a photosensitive layer which is photohardenable.

23. A process of claim 20 wherein said non-colored, tonable photosensitive overlay element is negative working.

24. A process of claim 23 wherein said non-colored, tonable photosensitive overlay element comprises a photosensitive layer which is phototackifiable.

* * * * *